United States Patent [19]

Selle et al.

[11] Patent Number: 5,124,275
[45] Date of Patent: Jun. 23, 1992

[54] METHOD OF MANUFACTURING BY AUTOALIGNMENT AN INTEGRATED SEMICONDUCTOR DEVICE COMPRISING AT LEAST THE FORMATION OF AN ENCAPSULATED FIRST ELECTRODE CONTACT PROVIDED WITH SPACERS AND OF A SECOND AUTOALIGNED ELECTRODE CONTACT ON THE FORMER

[75] Inventors: Daniel Selle, Brundy; Dominique Carisetti, Courtry, both of France

[73] Assignee: U.S. Philips Corporation, New York, N.Y.

[21] Appl. No.: 650,826

[22] Filed: Feb. 5, 1991

[30] Foreign Application Priority Data

Feb. 9, 1990 [FR] France .............................. 90 01531

[51] Int. Cl.$^5$ .............................................. H01L 21/28
[52] U.S. Cl. ........................................ 437/80; 437/195;
437/944; 148/DIG. 100
[58] Field of Search .................... 437/80, 195, 944;
148/DIG. 100

[56] References Cited

U.S. PATENT DOCUMENTS

| | | | |
|---|---|---|---|
| 4,253,888 | 3/1981 | Kikuchi | 148/DIG. 100 |
| 4,755,477 | 7/1988 | Chao | 437/80 |
| 4,824,800 | 4/1989 | Takano | 437/944 |
| 4,889,821 | 12/1989 | Selle et al. | 437/917 |
| 4,889,824 | 12/1989 | Selle et al. | 437/32 |
| 4,904,612 | 2/1990 | Zwicknagl et al. | 437/228 |
| 5,001,079 | 3/1991 | Van Laarhoven et al. | 437/50 |

FOREIGN PATENT DOCUMENTS 60-196958 10/1985 Japan .

Primary Examiner—Brian E. Hearn
Assistant Examiner—Laura M. Holtzman
Attorney, Agent, or Firm—Paul R. Miller

[57] ABSTRACT

A method of manufacturing by autoalignment an integrated semiconductor device is set forth comprising the realization on respective semiconductor layers of a first encapsulated electrode contact E provided with spacers and of a second autoaligned electrode contact B on the first contact thus equipped, which process comprises at least: $a_0$) the formation of a first and a second semiconductor layer for receiving the first and the second electrode contact, respectively; $b_0$) the formation by a so-called image reversal method of an opening $B_o$ with overhanging sides in a photoresist layer deposited on the first semiconductor layer; $c_0$) the deposition of a first metal layer forming the first electrode contact E in this opening, which contact has sides $F_2$ of a lower height than those $F_1$ of the photoresist layer, these sides $F_2$ having upper edges which are situated laterally at a small distance from the overhanging sides $F_1$ of the opening, thus leaving an aperture around the base of the first contact; $d_0$) the deposition of a first dielectric layer of a thickness greater than the value of the said small distance, which dielectric layer encapsulates the first contact without filling up the aperture; $e_0$) the lift-off of the dielectric and metallic layers around the first contact E, which remains encapsulated; $f_0$) the realization of spacers around the first encapsulated contact E.

13 Claims, 6 Drawing Sheets

METHOD OF MANUFACTURING BY AUTOALIGNMENT AN INTEGRATED SEMICONDUCTOR DEVICE COMPRISING AT LEAST THE FORMATION OF AN ENCAPSULATED FIRST ELECTRODE CONTACT PROVIDED WITH SPACERS AND OF A SECOND AUTOALIGNED ELECTRODE CONTACT ON THE FORMER

The invention relates to a method of manufacturing by autoalignment an integrated semiconductor device, comprising the realisation on respective semiconductor layers of a first encapsulated electrode contact provided with spacers and of a second autoaligned electrode contact on the first contact thus equipped.

The invention also relates to a method of manufacturing by autoalignment an integrated semiconductor device comprising a bipolar nonplanar heterojunction transistor.

BACKGROUND OF THE INVENTION

An autoalignment method for realising a bipolar planar heterojunction transistor is known from the European Patent Application EP 0 322 960. In this application, the method comprises first the realisation of the two base contacts of the transistor on the upper surface of the device. These contacts are subsequently encapsulated and provided with spacers. The distance between the outer edges of the spacers defines the dimension of the emitter contact in the opening formed by the spacers between the base contacts. The lateral dimension of the spacers defines also the distance which separates each of the base contacts from the emitter contact.

According to this known method, however, the base and collector emitter layers form a superimposed semiconductor layer structure, while all the electrode contacts are realised on the upper surface of the device. This method therefore comprises manufacturing stages by localized implantation of a kind suitable for connecting the electrode contacts to the respective electrode layers.

Furthermore, the localized implantations turn out to be costly at present since they are difficult to carry out with precision; it is preferred not to use these techniques for the realisation of it is preferred not to use these techniques for the realisation of integrated circuits in great numbers. Under these circumstances, the problem arises of how to provide the contacts directly on the relevant layers by the simplest possible method, while at the same time the electrodes are made to be as close to one another as possible in order to obtain satisfactory devices which occupy the smallest possible surface area on the integrated circuit. In fact, if the emitter and base contacts are far apart from one another, parasitic elements will appear during operation which diminish the performance of the transistor, as is known to those skilled in the art.

SUMMARY OF THE INVENTION

It is an object of the present invention, therefore, to provide an autoalignment method—implementing manufacturing stages of a first encapsulated electrode contact provided with spacers, and the autoalignment of one or several other contacts on this first contact— which may be applied to the realisation of non-planar devices.

Another object of the invention is to provide a method of realising a bipolar heterojunction transistor through the implementation of this autoalignment method in order to obtain a device of higher performance which is more compact and more simple to manufacture, and thus industrially more interesting and more promising.

These objects are achieved by means of a method in that this method comprises at least:

$a_0$) the formation of a first and a second semiconductor layer for receiving the first and the second electrode contact, respectively;

$b_0$) the formation by an image reversal method of an opening with overhanging sides in a photoresist layer deposited on the first semiconductor layer;

$c_0$) the deposition of a first metal layer forming the first electrode contact in this opening, which contact has sides of a lower height than those of the photoresist layer, these sides having upper edges which are situated laterally at a small distance from the overhanging sides of the opening, thus leaving an aperture around the base of the first contact;

$d_0$) the deposition of a first dielectric layer of a thickness greater than the value of the small distance, which dielectric layer encapsulates the first contact without filling up the aperture;

$e_0$) the lift-off of the dielectric and metallic layers around the first contact, which remains encapsulated;

$f_0$) the realisation of spacers around the first encapsulated contact.

Among the advantages offered by this process are:

it renders it possible to obtain in a semiconductor device a first electrode contact which has very small transverse dimensions, which is due to the use of the image reversal method;

it achieves that no bead or irregularity appears around the encapsulating agent during the formation of the encapsulation of this contact, which encapsulation is advantageous for the protection of the contact during the ensuing process steps. This is due to the formation of the aperture around the base of the contact, thanks to which aperture the second dielectric layer breaks easily at the level of the small distance separating the edges of the contact from the sides of the opening during the lift-off of the dielectric and metallic layers, leaving an encapsulation of a practically perfect shape, which then permits the realisation of spacers with great precision;

it renders it possible to obtain this result in a rapid, reliable, effective, and reproducible way, since the process of image inversion is readily controllable and the other steps are simple for those skilled in the art;

among its applications is the realisation of a high-performance non-planar transistor since it renders it possible to realise first the electrode contact whose dimensions are the most critical, on which electrode contact the second electrode contacts will be provided by autoalignment, whose distance from the first contact is in fact also a critical element; the present process renders it possible to eliminate all difficulties involved in the realisation of these critical dimensions or distances.

In the process steps mentioned above and in the ensuing process steps to be described below, another advantage lies in the fact that throughout the realisation of the integrated device the elements sensitive to engraving, such as the electrode contacts or the sides of electrode layers, are always protected.

Another advantage lies in the fact that at the end of the process the electrodes are not only separated by very precise interspacings, which enhance their performance, but that they are also free from any separating layers of dielectric material, such as exist in certain devices known to those skilled in the art for preventing shortcircuits, but which on the other hand create parasitic elements.

BRIEF DESCRIPTION OF THE DRAWING FIGURES

The invention will be better understood through reading of the following description illustrated by the annexed Figures in which.

DESCRIPTION OF THE INVENTION

The invention provides a method of realising an integrated semiconductor device comprising at least the realisation of two electrode contacts on semiconductor layers. In order to avoid the realisation of localised implantations, the device is preferably realised in the form of a structure of superimposed layers on which the electrode contacts are directly provided.

The invention will thus find a particularly interesting application in the realisation of bipolar heterojunction transistors, but the application of the invention to, for example, planar transistors is not excluded. The invention will be described below with reference to one of its most complex embodiments, i.e. the realisation of a bipolar nonplanar heterojunction transistor.

Figure 1A:
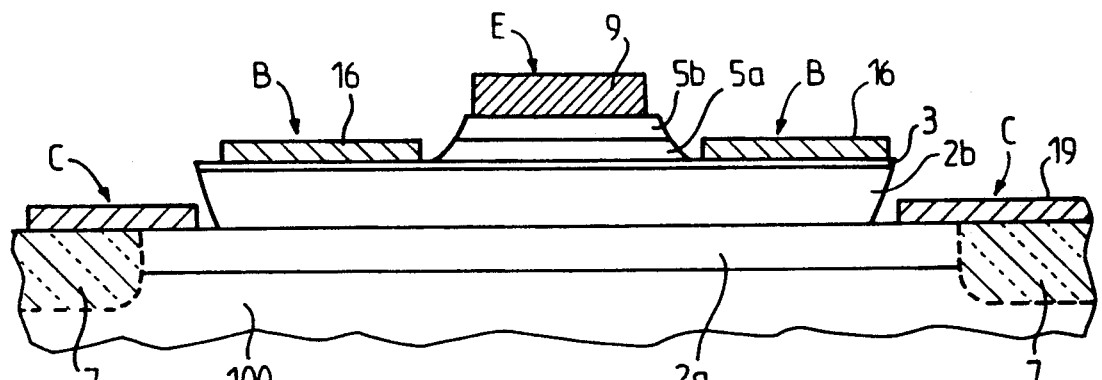
FIG. 1a represents a bipolar heterojunction transistor in cross-section realised by the process according to the invention.

As is shown in FIG. 1a in an example of an embodiment, a bipolar heterojunction transistor manufactured by means of the invention comprises first a layer 2 of a first conductivity type or collector layer on a smooth, for example, semi-insulating, substrate; a layer 3 of a second conductivity type or base layer; and a layer 5a of the first conductivity type or emitter layer.

In a particularly favourable embodiment, the transistor will be realised in a material of the III-V group, for example of gallium arsenide (GaAs). In this case the substrate will be semi-insulating and made of gallium arsenide GaAs, the collector layer 2 may be formed from two sublayers 2a and 2b, the layer 2a being of the N+ conductivity type and the layer 2b of the N conductivity type. The base layer 3 will be of P+ conductivity type gallium arsenide, and the emitter layer will be of gallium-aluminium arsenide (GaAlAs) of the N conductivity type forming a heterojunction with the base layer. An epitaxial layer 5b of gallium arsenide of the N+ conductivity type will preferably be formed at the surface of the emitter layer 5a in order to make contacting possible.

In this embodiment, where the transistor is of gallium arsenide, the metallic emitter contact is realised directly at the surface of the layer 5b, an etching step is carried out around the metallic emitter contact E 9 in order to disengage the base layer 3 for realising the base contacts B 16. Finally, etching takes place around the base contacts down to the collector layer 2a, on which the collector contacts C 19 are deposited.

In this embodiment, the base contact may be made from metals such as Au-Mn or Au-Be. The emitter contacts and collector contacts are made from metals such as AuGe/Ni/Ti/Au. A method of realising the autoalignment of the various electrode contacts on one another is described below. According to this method, in particular, it can be achieved that the base contact B is very close to the emitter pad E, but without the risk of short-circuiting with the emitter contact E. It is also possible to achieve that the emitter contact has a very small transverse dimension.

FIG. 1b shows this bipolar heterojunction transistor seen from above, the FIG. 1a discussed above being taken on the line I—I in this FIG. 1b.

Figure 1B:
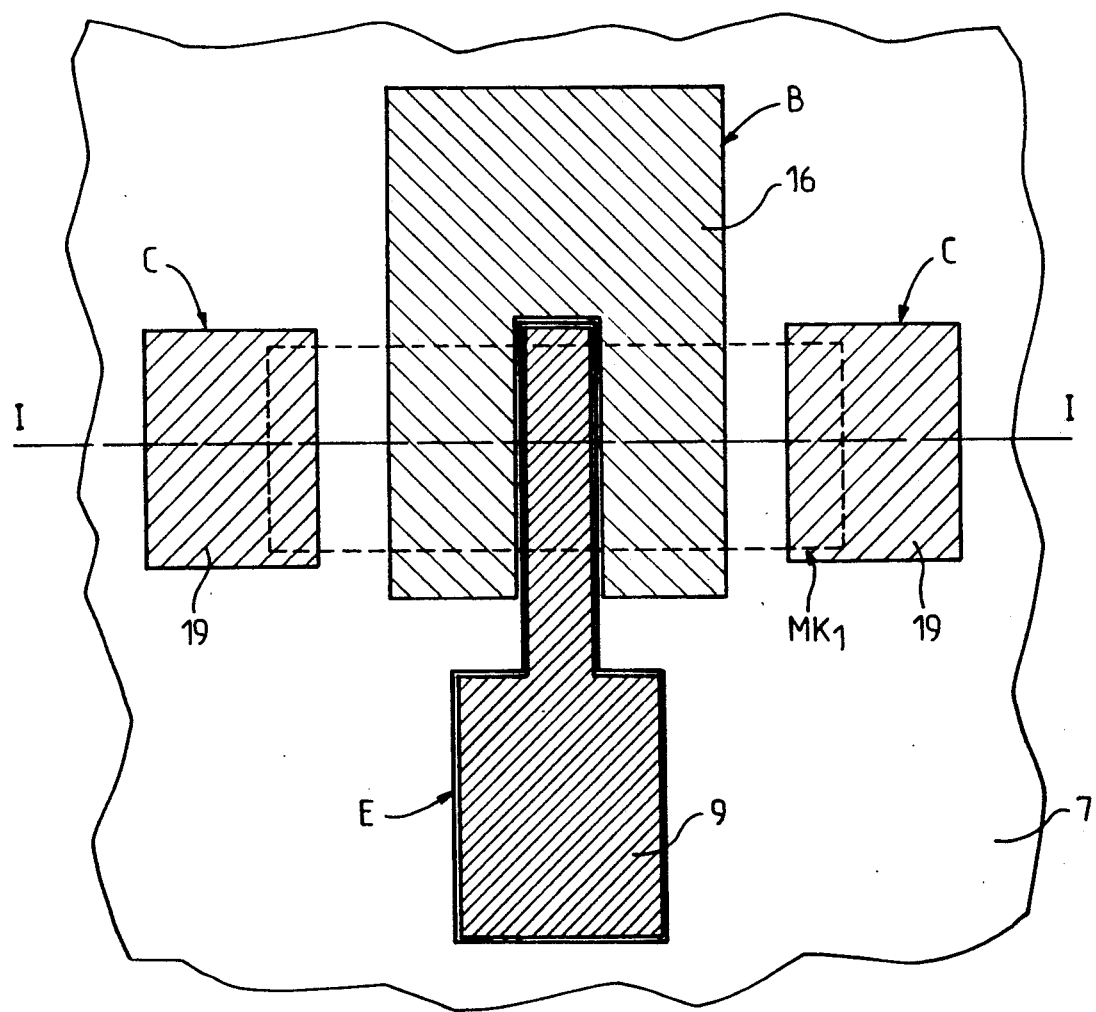
FIG. 1b represents an embodiment of this same transistor in plan view, the line I—I being the one on which the cross-section of the preceding FIG. 1a was taken.

As is shown in plan view in FIG. 1b in this embodiment, the transistor has an interlocking structure with two base fingers B and one emitter finger E. Two collector contact pads C are also shown.

In the method described below, the base fingers are provided by autoalignment on the emitter finger. The collector pads are then aligned on the base fingers.

This method renders it possible to obtain transverse dimenions which are extremely small, precise, and reproducible, and thus transistors of very small dimensions and improved performance. This means that the integration density can be increased and that the circuit performances are also improved.

Figure 2A:
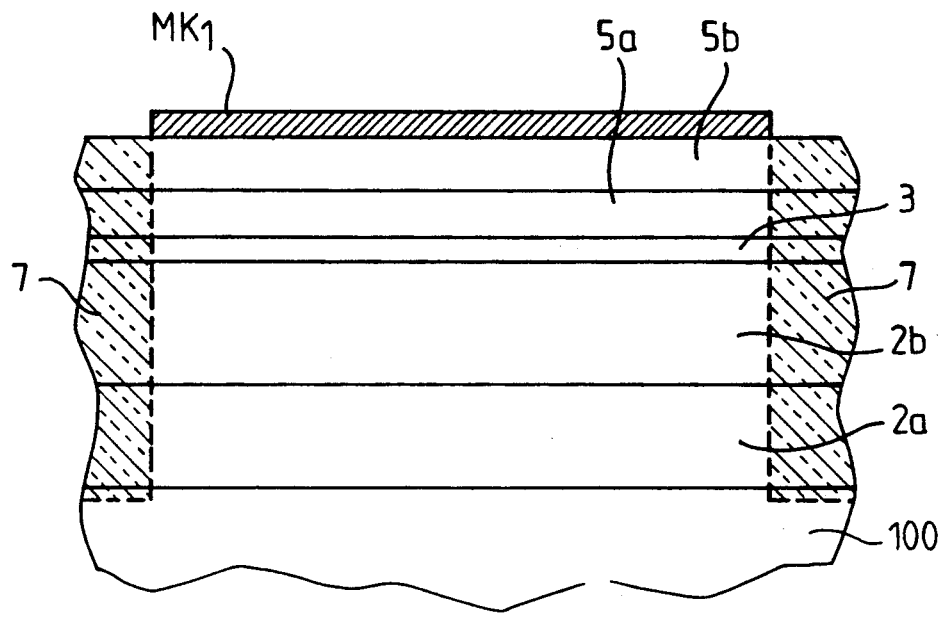
FIGS. 2a, 2b, 2c, 2d, 2e, 2f, 2g, 2h, 2i and 2j illustrate the process steps for realising the transistor by means of the method according to the invention.
Figure 2B:
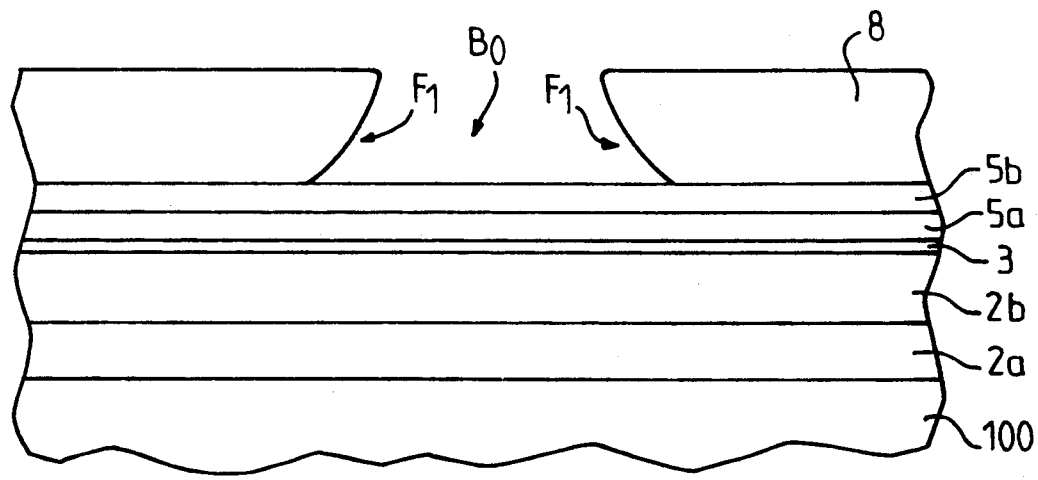
Figure 2C:
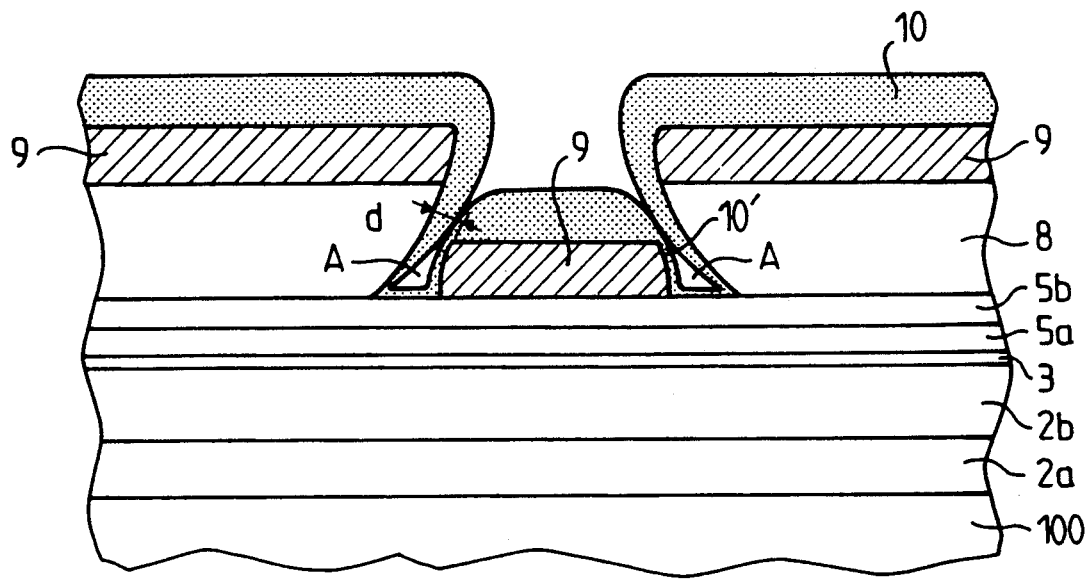
Figure 2D:
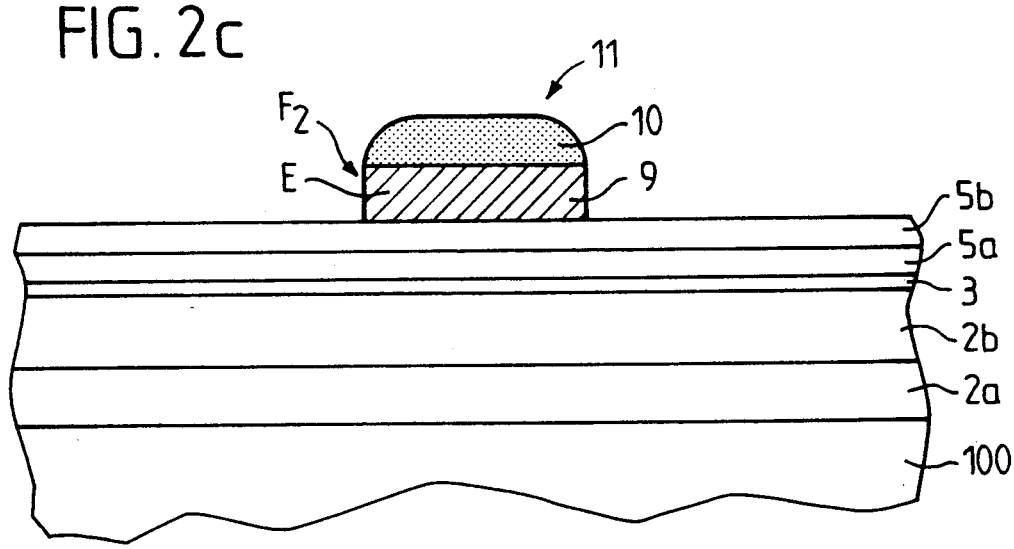
Figure 2E:
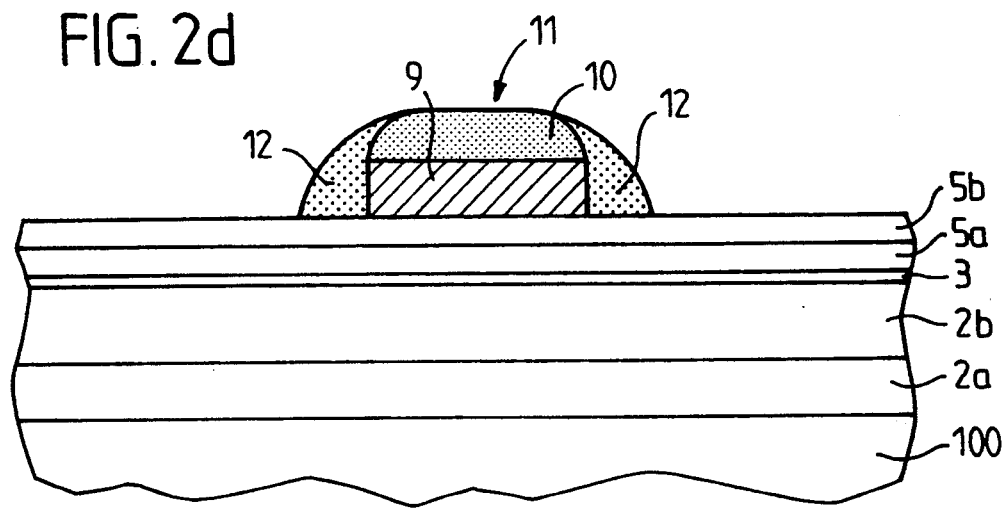

The method according to the invention essentially consists in the realisation on respective semiconductor layers 5, 3 of a first electrode contact E 9 which is encapsulated and provided with spacers, and of a second electrode contact B 16 autoaligned on the first contact thus equipped in accordance with the following sequence of process steps, including:

a₀) the formation of a first and a second semiconductor layer 3 and 5 for receiving the first and the second electrode contacts 9 and 16, respectively;

b₀) the formation by a so-called image reversal method of an opening B₀ having overhanging sides F₁ in a photoresist layer 8 deposited on the first semiconductor layer 5 or upper semiconductor layer (see FIG. 2b), which semiconductor layer may possibly be made up of two sublayers 5a and 5b;

c₀) the deposition of a first metal layer forming in this opening B₀ the first electrode contact E which has sides F₂ of lower height than the sides F₁ of the photoresist layer 8, while the upper edges of the sides F₂ extend laterally up to a small distance d away from the overhanging sides F₁ of the opening, thus leaving an aperture A around the base of the first contact E made of metal 9 (see FIG. 2c);

d₀) the deposition of a first dielectric layer 10 having a thickness greater than the value of the small distance d, which dielectric layer 10 encapsulates the first contact E without filling the aperture A (see FIG. 2c) while forming a pad 11;

e₀) the removal of the dielectric and metallic layers 8, 9, 10 by the "lift-off" method around the first contact E which remains encapsulated by the dielectric material 10 (see FIG. 2d);

f₀) the realisation of spacers 12 around the encapsulated first contact E (see FIG. 2e).

In step b₀) it is possible to form the overhanging sides $F_1$ of the opening $B_0$ by an image reversal method, either flat or convex curving towards the opening $B_0$ (see FIG. 2b).

In this case the upper edges of the sides $F_2$ of the first metal contact E extend up to the small lateral distance d from the overhanging sides $F_1$ of the opening $B_0$ in the part where the latter are convex.

Figure 4A:
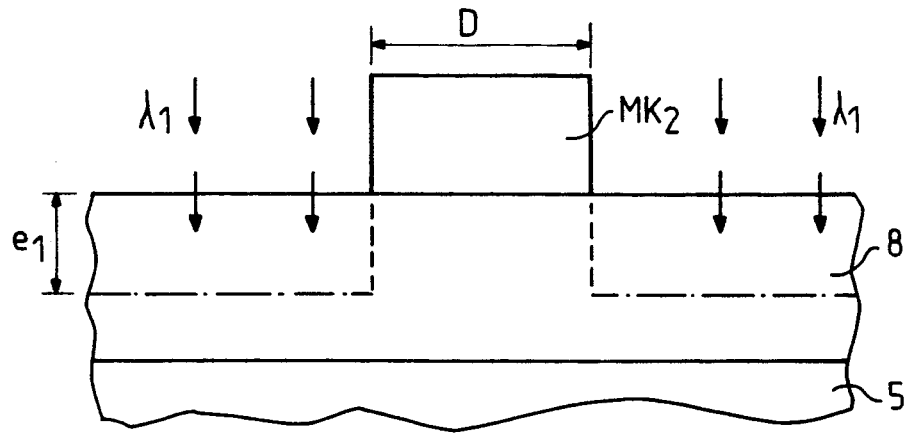
FIGS. 4a, 4b and 4c illustrate the method of realising an opening with overhanging sides in a photoresist layer by an image reversal method according to the invention.
Figure 4B:
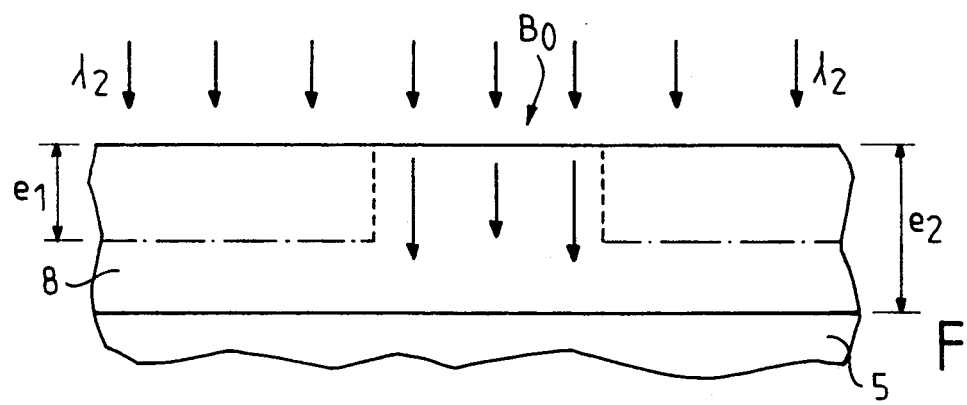
Figure 4C:
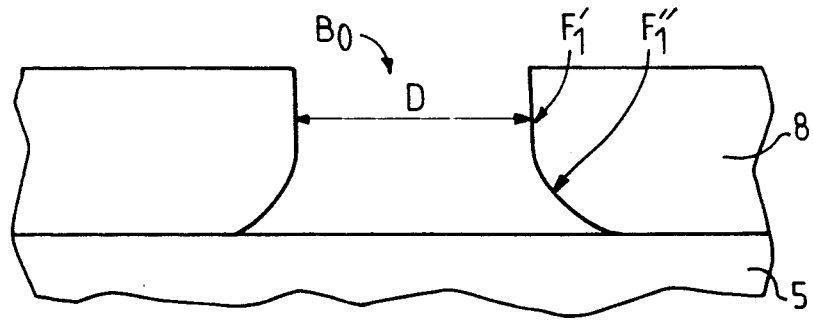

Preferably, the sides $F_1$ of the opening $B_0$ are realised with a substantially vertical upper portion $F'_1$ and a lower portion $F''_1$ (see FIG. 4c) having a convex shape curved towards the opening $B_0$. The method for achieving this result is described further below.

In this latter case, the upper edges of the sides $F_2$ extend up to the small distance d from the overhanging sides $F_1$ of the opening $B_0$ in the zone where the change in gradients between the substantially vertical upper portion $F'_1$ and the convex lower portion $F''_1$ (see FIG. 4c) is found.

To realise a non-planar device, and in particular a HBT transistor as described further below, the first layer 5 (5a, 5b) is formed at the surface of the second layer 3. These layers have opposed conductivity types.

Figure 2F:
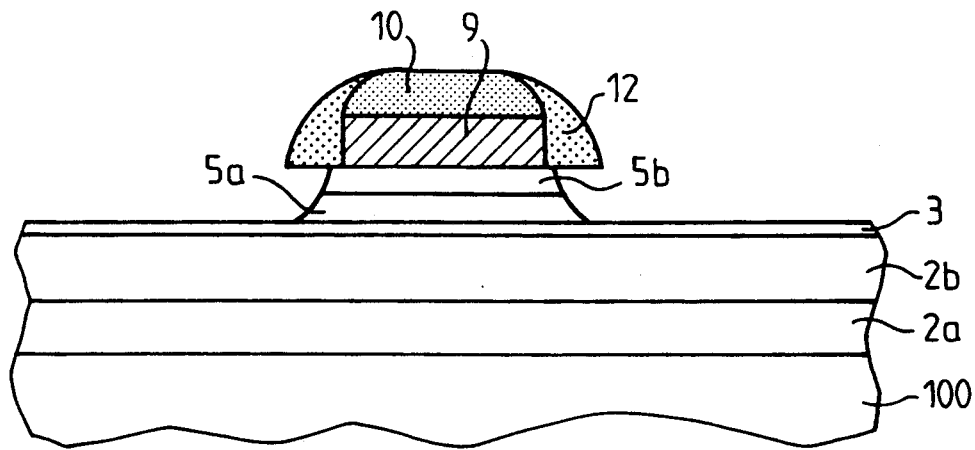
Figure 2G:
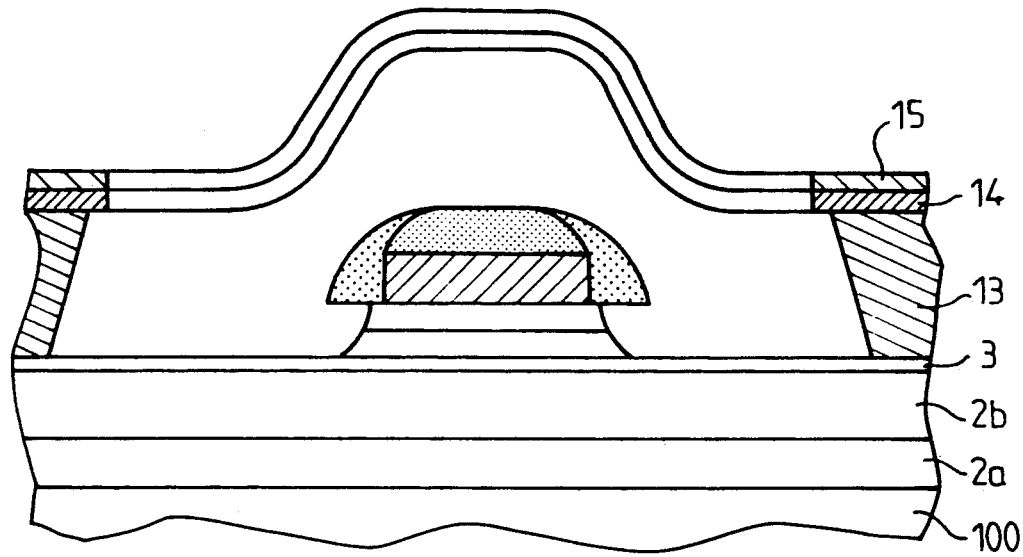
Figure 2H:
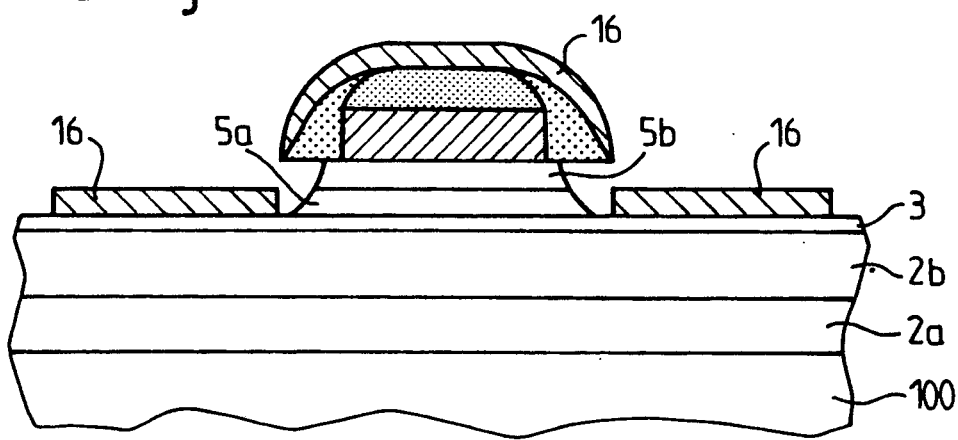

To autoalign the second contact B on the first contact E, the method is continued from the stage in which the pad 11 has been formed, consisting of the contact E of metal 9 and encapsulation 10, and provided with spacers 12, by proceeding as follows:

g₀) etching of the first or upper semiconductor layer 5 (5a, 5b) around the first encapsulated electrode contact E provided with spacers 12, which contact thus equipped serves as a mask, with underetching under the spacers 12 until the subjacent second semiconductor layer 3 is reached (see FIG. 2f);

h₀) the deposition of a second metallic layer 16 for forming the second electrode contact B, which is bounded on one side by the first encapsulated contact 11 provided with spacers 12 and is bounded on the other side by the edges of the opening of a mask, i.e. 13, 14, 15 (see FIGS. 2g and 2h);

i₀) the removal of the encapsulation 10, the spacers 12, the mask, and the portion of the metal layer 16 deposited on the encapsulation 10, the spacers 12 and the mask during the preceding step (see FIG. 1).

The removal of the undesirable elements in step g₀) may prove dangerous for the materials forming the semiconductor layers and for the metal contacts. According to the invention, therefore, it is recommended to realise the step i₀) in accordance with the following sequence:

i₁) the deposition of a third dielectric layer 17 of a different material from that of the encapsulation and the spacers with a substantially planar upper surface, leaving open the portion of the second metallic layer 16 which covers the first encapsulated electrode contact 11 provided with spacers 12 (see FIG. 2i), i₂) the removal of the portion of the second metallic layer 16 which covers the first encapsulated electrode contact 11, this first contact E being protected by the layers 10, 12 with the second electrode contact B being protected by the third dielectric layer 17 (see FIG. 2j), i₃) the removal of the spacers 12 and of the encapsulation 10 of the first electrode contact (see FIG. 2j), i₄) the removal of the third dielectric layer 17 and the lift-off of the mask which has served to delimit the second contact B and of the portion of the metallic layer 16 which covers it (see FIG. 1aa).

It is obvious to those skilled in the art that it is also possible to use the pad 11 formed by a contact E encapsulated by the layer 10 and provided with spacers 12 for realising a second electrode B autoaligned on E, the two electrodes being realised on the adjacent layers whose upper level is in a single plane. In this case, the principal advantage lies in the use of the image reversal method for obtaining a well-defined first contact in a simple manner. Another advantage follows from the fact that the pad 11 formed by the first encapsulated contact has a faultless shape, which renders it possible to realise spacers with great precision.

It will be shown below how to apply these essential steps to the realisation in particular of an HBT. The manufacturing process of such an HBT transistor comprises at least the following steps:

a) formation of a substrate 100 of a monocrystalline semiconductor material, for example of the III-V group, having an oriented upper surface, for example in a crystallographic direction [100]. This substrate is preferably chosen to be semi-insulating so that the process can be carried out in synergy with the manufacturing processes of most common integrated circuits. The substrate will be favourably made of gallium arsenide (GaAs), as was stated above. This substrate is made semi-insulating, for example, by doping with iron ions (Fe). This substrate could also be realised in gallium arsenide doped with indium (In) and baked, which renders it possible to obtain materials free from dislocations and compatible with the subsequent growing of epitaxial layers of the III-V group;

b) realisation of two planar epitaxial layers of gallium arsenide for forming the collector, successively a layer 2a of the N+ conductivity type and a layer 2b of the N conductivity type. The epitaxial growth of these layers may be realised in the vapour phase or in the liquid phase. It will preferably be realised by an organometallic method called MOCVD, or by MBE. The layer 2a will have a thickness of 0.2 to 1 μm, preferably 0.5 μm. This layer 2a of the N+ conductivity type is obtained, for example, by doping with silicon ions (Si), approximately 3 to $5 \times 10^{18}$ ions per cm³. The thickness of the layer 2b is of the order of 0.3 μm and the N conductivity type is obtained, for example, by doping with silicon ions (Si), $5 \times 10^{16}$ ions per cm³;

c) realisation at the surface of the two preceding layers of a planar epitaxial layer 3 of a ternary or binary material of the III-V group, for example, gallium arsenide (GaAs), of the P+ conductivity type forming the base layer. The growth of this epitaxial layer will be realised by the same process which was chosen for the growth of the collector layers 2a and 2b.

The base layer 3 will have a thickness of the order of 0.1 μm and will be doped with, for example, Zn or Mg ions with a concentration higher than or equal to $10^{19}$ per cm³;

d) realisation of two planar superimposed epitaxial layers, the first layer 5a of a ternary material of the III-V group, for example gallium-aluminium arsenide (GaAlAs) of the N conductivity type forming the emitter layer, and the second layer 5b of a binary or ternary material, for example GaAs or GaInAs, of the N+ conductivity type, so that the emitter contact E can be provided. The epitaxial growth of these layers will be realised by the same process as chosen for the growth of the preceding layers (see FIG. 1a).

The emitter layer $5a$ will have a thickness of the order of 0.15 μm and the contact layer $5b$ will have a thickness of the order of 0.15 μm. The emitter layer $5a$ will be doped with, for example, Si ions with a concentration of the order of $5 \times 10^{17}$ per cm$^3$, and the contact layer $5b$ with Si ions with a concentration in the order of $2 \times 10^{18}$ per cm$^3$.

The emitter layer $5a$ of gallium-aluminium arsenide (GaAlAs) will preferably have an aluminium (Al) concentration of 0.25;

e) the cross-section in FIG. $2a$ shows the device at this stage of the process. This step comprises the implantation of boron ions (B+) for delimiting the active zone of the transistor. The ions are implanted with an energy and a dose which are sufficient to render the epitaxial layers insulating in the peripheral zones 7. This will be preferably realised by means of a succession of four implantations of increasing energy with a maximum value of 490 KeV, in order to obtain a constant boron concentration value through the depth of the material. During the implantation, the active zone is protected by a mask MK1 realised, for example, in silicon dioxide (SiO$_2$) of 2 μm thickness. This mask is removed at the end of the operation.

The hatched portions in FIG. $1b$ show in plan view the active region of the transistor delimited by the mask MK1, while the zones outside the hatched portions are insulated (regions 7);

f) realisation of an opening $B_O$ in a photoresist layer 8 by photolithography. This opening $B_O$ is realised by an image reversal method. According to this method, an opening with overhanging sides is obtained which is particularly well adapted to the double lift-off operation which is to follow. The opening $B_O$ has the shape of the pattern of the emitter contact E and, for example, a transverse dimension D in the cross-section taken on the line I—I in FIG. $1b$.

The so-called image reversal method is particularly known from two publications in "Proceedings of SPIE", vol. 771 "Advances in resist technology and processing IV" Mar. 2–3, 1987, Santa Clara, Calif. The first publication is entitled "Image reversal: a practical approach to submicron lithography" by Vic Marriot, César M. Garsa et al. This publication is found on page 221 of SPIE vol. 771. The second publication is entitled "Image reversal: a practical approach to lift-off" by Susan K. Jones and Richard C. Chapman. This publication is found on page 231 of SPIE vol. 771. The image reversal method is based on the following facts. At the present moment submicron details are achieved through the use of photolithography, but the demand for geometries of the order of 0.5–0.8 μm is expected in the near future and we do not have to wait long before geometries of the order of 0.4 μm will be sought. A certain number of techniques have already been employed in industry, for example, electron beam, X-ray, and multilayer photoresist methods; while single-layer photolithography is the most attractive from the industrial point of view. Progress has been made by increasing the numerical aperture of the lenses or by using light sources of a shorter wavelength. Wavelengths of 365 nm have thus been achieved with conventional photoresists, but the absorption at these wavelengths limits the contrast and the resolution.

It has been suggested that the so-called image reversal method should produce a better contrast, which would lead to a better focusing depth and a better control of the definition. The image reversal method has already been cited in the literature since 1960. A great number of approaches have been published in the years since then. In general, the image reversal method entails the use of an amine incorporated in the photoresist either before the covering by the photoresist or in the gas phase after the photoresist has been deposited on the semiconductor layer, for example, and exposed to the light source. The amines form an amine salt with an indene carboxylic acid which is formed by exposure to the light source. An indene insoluble in alkaline watery solutions is formed at high temperatures. After exposure, the surface previously not exposed is soluble in an alkaline developing agent in water so that the image is reversed during development. With such a method, the first publication cited indicates that it is possible to obtain openings of very small dimensions, particularly submicron ones. The second publication cited shows that under different operating conditions the sides of the opening may be either positive, or vertical, or overhanging (negative), as is shown in FIG. 5 of this second publication.

In the present invention the method described in the cited publications are exclusively used for obtaining an opening $B_O$ with overhanging sides $F_1$ in the photoresist layer 8 deposited on the upper semiconductor layer $5b$.

According to the invention, it is possible to use the method of the second cited publication directly for giving overhanging sides, but preferably a particular method will be used which renders it possible to obtain overhanging sides $F_1$ which have a concave form in which the curved portion is directed towards the opening $B_O$, and preferably a method which renders it possible to obtain an opening $B_O$ of which the upper portion $F'_1$ of the sides $F_1$ is substantially vertical, while the lower portion $F''_1$ is convex with the curved portions directed towards the opening $B_O$ (see FIG. $4c$).

Figure 4D:
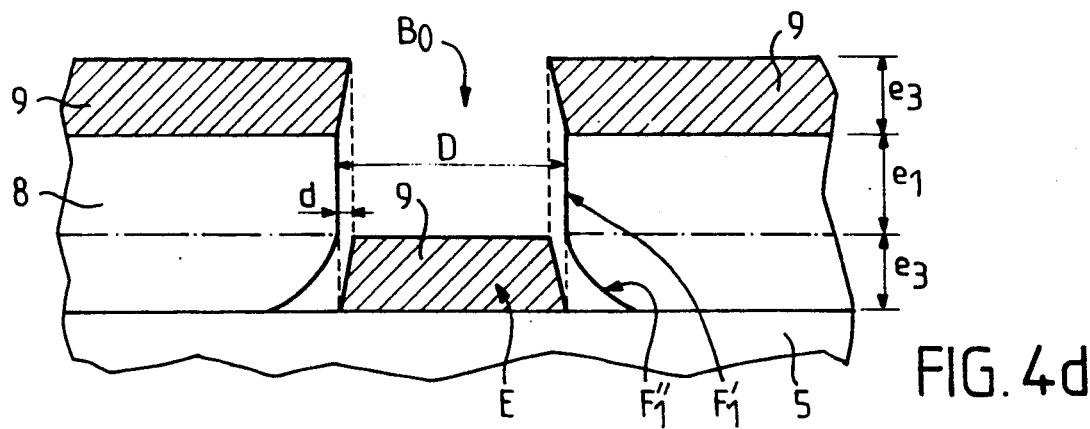
FIG. 4d shows the formation of the small distance d and the aperture A for obtaining a first contact according to the invention.

The sequence of the preferred process steps for obtaining such a profile is illustrated in FIGS. $4a$–$4c$. To obtain the desired profile, operations are carried out as follows:

the semiconductor surface $5b$ is first cleaned with, for example, hot alcohol, the device is baked at 135° C. for approximately 10 minutes, the surface $5b$ is covered with a layer of AZ 5214 E, which is a positive resin initially and reversible by treatment, by a centrifuge process at 7000 rpm for 40 seconds, followed by .

a heat treatment at 90° C. for 30 minutes, irradiation under ultraviolet light with a wavelength $\lambda_1$ of 310 nm and a power of 80 mJ per cm$^2$ of the portion outside the opening $B_O$, the latter being masked by a mask MK$_2$ having a transverse dimension D (see FIG. $4a$). This operation renders possible irradiation of the resin outside the region $B_O$ covered by MK$_2$ to a depth $e_1$ corresponding to the height eventually required for the substantially vertical portions $F'_1$ of the sides of the opening $B_O$. The mask MK$_2$ is then removed, a reversal heat treatment at 120° C. for 15 minutes, irradiation with ultraviolet rays of a wavelength $\lambda_2$ of 365 nm ($\lambda_2 \geqq \lambda_1$) with a power of 150 mJ, by which the entire thickness $e_2$ of the resin in the region $B_O$ can be irradiated while the external regions have been cured during the preceding operations (see FIG. $4b$), a development for 2 minutes 15 in a solution made of a mixture of 200 ml of MF 312 + 250 ml of H$_2$O$_2$. This operation eliminates the resin in the region $B_O$ (see FIG. $4c$). The upper portion of thickness $e_1$ of the resin 8 which has been cured by the previous operations forms the practically vertical sides $F'_1$. The lower portion of the resin 8 which has only been irradiated forms the convex sides $F''_2$ by underetching, the curved portion thereof being directed toward the opening $B_O$. The opening $B_O$ thus has a transverse dimension D in its upper portion. Commercially available is the resin AZ 5214 E from HOECHST Cellanese Corp. Route 202-206 North PO Box 2500, Sommerville, N.J. 08876. Alternatively, it is possible to purchase the MF312 from the manufacturer SHIPLEY COMPANY INC. NEWTON MASS., deoxidation by means of 5% $NH_4OH$ for one minute plus a first rinsing followed by a second rinsing in water 18 M$\Omega$;

g) deposition of a metal layer 9 for the formation of an ohmic contact E on the emitter layer and preferably composed as follows: AuGe 85 nm/Ni 10 nm/Ti 100 nm/Au 200 nm, being in total approximately 395 nm (see FIG. 4d). It can be seen that during the deposition of the metal layer 9 the base of the deposition corresponds exactly to the transverse dimension D. But as the metal layer 9 grows, it tends to narrow the opening $B_O$ so that, when the desired thickness for this layer, which is $e_3 = e_2 - e_1$, is reached, the upper portion of the opening $B_O$ is smaller than the initial value D. The result is that the sides $F_2$ of the pad E of metal 9 which is deposited in the opening $B_O$ are slightly inclined, the upper portion of the pad E is of a smaller dimension than its base, and the upper edge of the pad E is separated from the sides $F_1$ of the opening $B_O$ by a small distance d (see FIG. 4d).

This small distance d thus formed is the key to the continuation of the process, the so-called double lift-off.

To be sure, the manner in which the small distance d is realised has here been described for particular materials, by way of example, and illustrative process steps. Those skilled in the art, however, may easily find equivalent materials for implementing these steps in a similar manner.

Similarly, as has been stated, this process is not exclusive to an HBT.

Whatever the method, it is important for this step that the profile $F_1$ of lacquer 8 and the thickness of the metal deposition 9 are so chosen that the distance d between the overhanging side $F_1$ of the lacquer layer 8 and the upper edge of the metal deposition 9 is very small, and at the end of this step, in view of the respective shapes of the sides $F_1$ and $F_2$, there is an aperture A between the overhanging sides $F_1$ of the lacquer layer 8 and the sides $F_2$ of the metal pad 9 of the emitter E.

h) deposition of a silicon dioxide layer ($SiO_2$) 10 of a thickness of the order of 350 nm by the plasma enhanced chemical vapour deposition technology (PECVD) at 80° C. Since the distance d between the overhanging sides $F_1$ of the lacquer layer 8 and the upper edge of the metal deposition 9 in the opening $B_O$ is very small, this interspacing is rapidly stopped up during the deposition of the silicon dioxide 10, which means that the quantity of silicon dioxide present in the aperture A is very limited, as is shown in FIG. 2c.

i) Removal of the metal layer 9 and the silicon dioxide 10 in the zones situated outside the emitter contact E by dissolving of the resin 8 in acetone, which is the so-called lift-off technique. At the end of this operation, the emitter contact E of metal 9 encapsulated by a silicon dioxide layer 10 is conserved, thus forming an encapsulated emitter contact pad 11. This lift-off operation is facilitated by the presence of the apertures A being filled by the silicon dioxide layer 10 during the deposition of the latter, while particularly the danger of edges arising around the pattern 11 is avoided. Thus the pattern of the encapsulated emitter has an almost perfect shape.

Finally, the silicon dioxide layer 10' (see FIG. 2c) of small thickness around the sides of the emitter contact can be removed by a slight etching in the dry state carried out by the RIE method with the gases $CHF_3$—$SF_6$. The device at this stage of the process is illustrated in FIG. 2d. If one opts for the conservation of the layer 10', it is necessary to know that this is of the order of 20-30 nm, which is ten times thinner than the thicknesses of the layers of dielectric material used for realising the spacers. It is sufficient during the next step, therefore, to prolong the etching resulting in the formation of the spacers 12 very slightly in order to obtain the latter in the required dimension.

j) realisation of spacers 12 made of, for example, silicon dioxide $SiO_2$ around the emitter contacts 11 which comprise the metallization 9 and the encapsulating layer 10. This step is illustrated in FIG. 2e. A technique for realising spacers is described, for example, in the European Patent Application no. 0 322 960 A1. This document refers to a technique described in the publication entitled "Etch-Defined Patterning of Hyperfine Refractory Metal Silicide MOS Structure" by SHINIJI OKAZAKI in IEEE Transactions on Electron Devices, vol. ED38, no. 11, Nov. 1981, pp. 1364-1368. In the cited Patent Application, the spacers 12 were realised from silicon nitride. In the present application, silicon dioxide ($SiO_2$) is preferably chosen, i.e. the same dielectric material as in the encapsulating layer 10 of the emitter contact E forming the pad 11 already realised. The manufacturing technique for the spacers will be better understood with reference to FIGS. 3a and 3b.

Figure 3A:
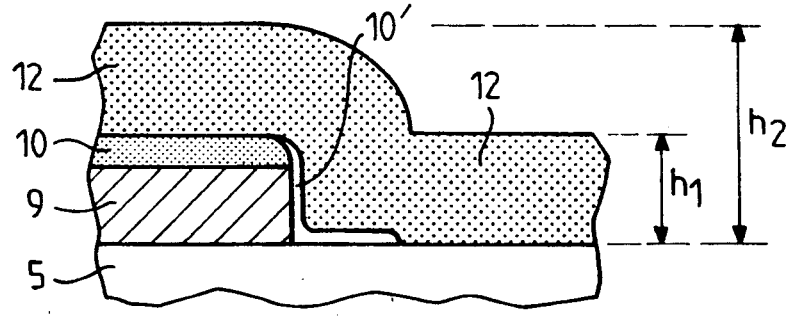
FIGS. 3a and 3b illustrate the process steps for realising spacers around an encapsulated contact.

As is shown in FIG. 3a, a layer 12 of dielectric material $SiO_2$ is deposited in a uniform manner on the device with a specific very precise thickness $h_1$ chosen for the dimension by which the base electrode B to be finally realised should be separated from the emitter contact E. The uniform deposition of the layer 12 results since it follows very exactly the details and reliefs of the device as realised in the preceding steps. The total thickness of the layers 9, 10, 12 is $h_2$. A uniform etching is then carried out on the device, for example, by reactive ion etching (RIE) so that an equal thickness of material 12 is removed at every point.

Figure 3B:
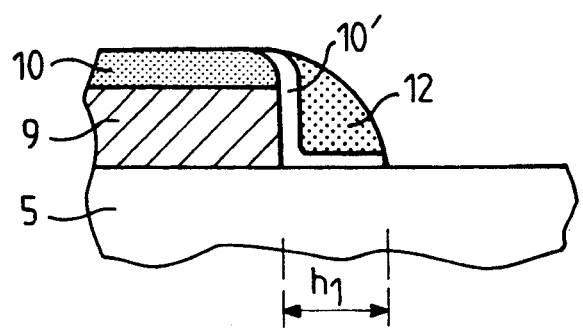

Since the thickness of the material 12 is practically equal to $h_2$ along the sides of the pad 11, as is shown in FIG. 3a, then after this etching, there remains along these sides a portion of the dielectric layer 12 which was provided along these sides and which has a lateral dimension perpendicular to these sides $F_2$ which is the specific dimension $h_1$. At the end of this etching treatment, the device is shown in FIG. 3b. The portion of the layer 12 remaining present along the sides of the pad 11 is called the spacer.

The spacer fulfils several functions here:
preventing the reactive substances used for etching the emitter finger E from coming into contact with the metal layer 9 of the emitter contact, and also the etching reaction of the emitter layers 5a and 5b from being disturbed, preventing the pad 11 itself overhanging the etching side of the layers 5a, 5b, i.e. underetching of the emitter contact itself taking place during the subsequent steps, spacing apart the emitter contacts from the base contacts to reduce the risk of short-circuiting, delimiting with precision the distance between the emitter contact E and the subsequently realised base contact(s) B. The dimension $h_1$ of the spacers is chosen as a function of the etching process for the emitter layers 5a and 5b used. In the embodiment described here, the etching is carried out in the wet state; under these conditions the lateral etching is very close to the etching depth, which means that the spacers must have a thickness of the order of 0.5 $\mu$m. This thickness may be reduced; for example, may be of the order of 0.1 $\mu$m if dry etching is chosen, for example by RIE in anisotropic manner.

Figure 2I:
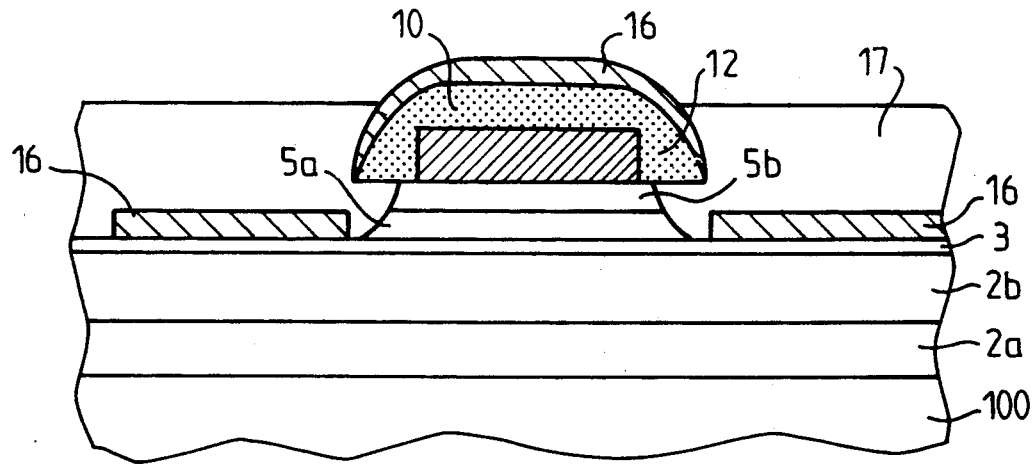
Figure 2J:
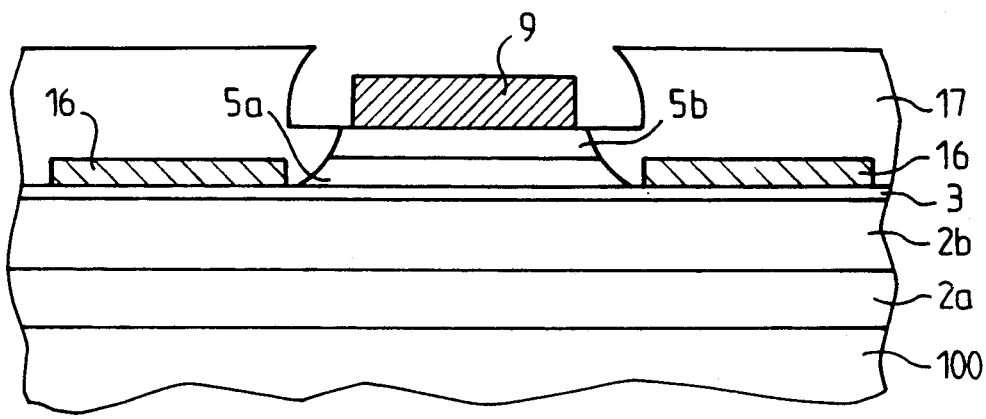

Etching of the layer 12 during the step in which the spacers themselves are realised is preferably carried out in the dry state by RIE with the gases $CHF_3$ and $SF_6$;

k) etching of the emitter layers 5a and 5b until the base layer 3 is exposed, the pad 11 with the spacers 12 serving as a mask. This etching takes place in two stages in the embodiment presented here, but other possibilities exist subject to different solutions with regard to etching. The surface layer 5b is etched selectively relative to the layer 5a by means of an NaOH solution (20 ml 0.5 N)/$H_2O_2$ (200 ml). The base layer 3 is etched with an $NH_4OH$ solution (30 ml)/$H_2O_2$ (1 ml)/$H_2O$ (500 ml) at ambient temperature. This step is illustrated in FIG. 2f;

l) definition of the base metallization pattern B or base contact B in a layer of photosensitive resin by a photolithography process which is known per se to those skilled in the art. This step is illustrated in FIG. 2g. A triple-layer system is preferably used, consisting of:

a layer of resin 13 (PMMA 9% 496K) (polymethyl metacrylate, concentration 9%, molecular weight 496), a nitride layer 14 ($Si_3N_4$), a layer of resin AZ 407015 of the same manufacturer as the resin AZ 5214 E referred to earlier, the pattern is first defined in the layer 15 by photolithography. Then the layer 14 is etched by RIE, the layer 15 serving as a mask. The resin layer 13 is irradiated through the developed opening. This technique renders it possible to define an overhanging profile which is indispensable for obtaining a good cutting of the metal film, especially at the level of the transition constituted by the emitter finger with the metal-silica pad on top, as shown in FIG. 2g. The emitter finger here is understood to be the layers 5a and 5b which form the emitter, the metal layer 9 being the emitter contact E;

m) deposition of a metal layer 16 suitable for forming the base contacts B. The metal layer 16 could favourably be made of gold-manganese (Au-Mn), gold-beryllium (Au-Be), gold-zinc (Au-Zn). It will preferably be Au-Mn at a rate of 4% which renders it possible to obtain a contact of low resistivity. The pattern of base metallzation B is delimited by the opening in the triple layer 13, 14, 15 described above and by the emitter finger covered by the silicon dioxide encapsulation 10 and provided with spacers 12. The metal outside this pattern is subsequently removed by a "lift-off" technique known per se, as shown in FIG. 2h.

n) deposition of a layer of positive resin 17 of the order of 1 $\mu$m thickness, for example, of AZ 4110 and planarization of this layer by a succession of exposures to ultraviolet radiation of 310 nm wavelength, followed by high-temperature treatments in the region of 150°-180° C., which steps make the resin flow. A light etching by RIE serves to eliminate the resin layer remaining at the surface of the pad 11 and also serves to free the surface of the metal layer 16, as is shown in FIG. 2i;

o) etching in the uncovered zone of the metal layer 16 by means of a solution of $KI-I_2$ and etching of the silicon dioxide $SiO_2$ layer which forms the encapsulation 10 and the spacers 12 by means of a buffer solution of hydrofluoric acid. The resin 17 is subsequently removed by dissolving in acetone. This step is illustrated in FIG. 2j.

The metallizations 9, 16 of the emitter contact E and the base contact B are constantly protected during the operations thanks to this process, as are the layers 5a and 5b which form the emitter.

p) definition of the collector contact pattern C in a positive resin layer of a thickness of approximately 2 $\mu$m, for example of AZ 4210, by photolithography. Etching of the base 3 and collector 2b layers for achieving the collector contact layer 2a is then carried out in the openings of the mask thus obtained. This step is not illustrated but see FIG. 1a.

Etching is carried out, for example, in the wet state by a mixture of dilute citric acid/hydrogen peroxide ($H_2O_2$) in the ratio 1 kg/l;

q) deposition of a metal layer 19 suitable for forming the collector contacts C. The metal deposited outside the collector pattern is removed by "lift-off" by dissolving the resin layer in acetone, as is shown in FIG. 1a. The metal which is to form the layer 19 for contact C will preferably be the multilayer already used for realising the emitter contact E, i.e. Au-Ge (85 nm)/Ni (10 nm)/Ti (100 nm)/Au (200 nm). The contacts E, B, C of the electrodes will all be baked simultaneously at the end of the process at a temperature of 370° C. for approximately 30 seconds.

As was stated before, FIG. 1b represents a plan view of an embodiment of the HBT transistor for which the method according the invention was used. The broken line represents the edges of the mask $MK_1$ which covered the active zone during step e) and which accordingly delimits the active zone. Other forms of the transistor are possible, especially other electrode configurations. Other materials may also be considered for realising a transistor, while the structure may or may not comprise one or several heterojunctions.

On the other hand, it has been seen that the realisation of the encapsulated emitter contact pad as described, which is surrounded by spacers, could be used for realising a planar device, for example a planar HBT of the structure which is known from European Patent EP 0 322 960 A1.

A bipolar heterojunction transistor realised in accordance with the invention offers numerous advantages, indeed, it offers autoalignment of the base contacts B on the emitter contact E, which renders it possible to reduce the base contact resistances and is essential for improving the operating frequency of this type of transistor.

The kind of method according to the invention is particularly advantageous since it renders it possible at the same time to protect the emitter contact during the process and to avoid that this emitter metallization induces electrochemical effects into the etching solution which could disturb the etching profile, a perfect control of this profile being necessary for the autoalignment of the base contact. According to the invention, the emitter and base electrodes are also very close together without the metallizations of the emitter or base being in danger of becoming short-circuited. It is also avoided that the emitter metallization overhangs the etching side, which could cause the metal to flow or to diffuse along this side during baking of the ohmic contact. This would tend to create leakage currents and to reduce the emitter-base breakdown voltage.

We claim:

1. A method of manufacturing by autoalignment an integrated semiconductor device, comprising the realisation on respective semiconductor layers of a first encapsulated electrode contact E provided with spacers and of a second electrode contact B autoaligned with the first electrode contact, which process comprises at least:

$a_0$) forming a first and a second semiconductor layer for receiving the first and the second electrode contact, respectively;

$b_0$) forming by an image reversal method an opening $B_o$ with overhanging sides in a photoresist layer deposited on the first semiconductor layer;

$c_0$) depositing a first metal layer forming the first electrode contact E in this opening, which contact has sides $F_2$ of a lower height than sides $F_1$ of the photoresist layer, the sides $F_2$ having upper edges which are situated laterally at a small distance from the overhanging sides $F_1$ of the opening, thus leaving an aperture around the base of the first electrode E contact;

$d_0$) depositing a first dielectric layer of a thickness greater than the value of the small distance, which first dielectric layer encapsulates the first electrode contact E without filling up the aperture;

$e_0$) lifting-off the dielectric and metallic layers around the first electrode contact E, which remains encapsulated; and $f_0$) forming spacers around the first encapsulated electrode contact E.

2. A method as claimed in claim 1, characterized in that during step $b_0$) the overhanging sides of the opening $B_0$ in the photoresist layer are formed with a substantially vertical upper portion $F'_1$ and a lower portion $F''_1$ which has a convexity where the curved part is directed toward the opening $B_0$.

3. A method as claimed in claim 2, characterized in that, in order to achieve that the sides of the opening $B_0$ having a substantially vertical upper portion $F'_1$ and a lower portion $F''_1$ which has a convexity directed towards the opening $B_0$, the image reversal process is followed comprising at least the following steps:

covering the upper surface of the first semiconductor layer with a photoresist of the positive type which is reversible by treatment, in which the opening $B_0$ with overhanging sides is to be provided, and carrying out a first heat treatment of this photoresist;

forming a mask for protecting the surface of the photoresist region destined finally to form the opening $B_0$;

irradiating the photoresist through a thickness $e_1$ smaller than its total thickness and approximately equal to the height desired for the portion $F'_1$ of the vertical sides of the opening $B_0$, by a first ultraviolet radiation $\lambda_1$;

removing the mask and baking the photoresist for curing it in the irradiated regions;

completely irradiating the photoresist throughout its thickness, the regions outside the region of the future opening $B_0$ having become a mask for the present operation as a result of the preceding operations, the irradiation taking place with ultraviolet light $\lambda_2 \geq \lambda_1$; and developing the photoresist in an agent which is capable of dissolving the irradiated regions which have not been baked at the end, including the region of the opening $B_0$, which results in an opening having substantially vertical sides $F'_1$ in the portion which was irradiated through a small thickness and baked after irradiation, and having underetched sides $F''_1$ in the portion which was irradiated throughout its thickness without final baking after irradiation.

4. A method as claimed in claim 2, characterized in that during step $c_0$) the upper edges of the sides $F_2$ of the first electrode contact E extend up to the small lateral distance d from the overhanging sides $F_1$ of the opening $B_0$ in the portion where the latter sides have their change in curvature between $F'_1$ and $F_1$.

5. A method as claimed in claim 1, characterized in that during step $f_0$) the spacers are formed by deposition of a second dielectric layer of a specific uniform thickness $h_1$, after which this second dielectric layer is uniformly etched for a height which is equal to the specific value $h_1$, this second dielectric layer being made of a material identical to that of the first dielectric layer.

6. A method as claimed in claim 5, characterized in that during step $a_0$) the first layer is formed at the surface of the second layer and the first layer is of a first conductivity type and the second layer of a second conductivity type.

7. A method as claimed in claim 6, characterized in that it in addition comprises:

$g_0$) etching of the first or upper semiconductor layer around the first encapsulated electrode contact E provided with spacers, which contact thus etched serves as a mask, with underetching under the spacers until the subjacent second semiconductor layer is reached;

$h_0$) depositing of a second metallic layer for forming the second electrode contact B, which is bounded on one side by the first encapsulated contact E provided with spacers and on the other side by the edges of the opening of a mask;

$i_0$) removing of the encapsulation, the spacers, the mask, and the portion of the metal layer deposited on the encapsulation, the spacers, and the mask during the preceding step.

8. A method as claimed in claim 7, characterized in that during step $i_0$) removal of the undesirable elements comprises:

$i_1$) depositing a third dielectric layer of a different material from that of the encapsulation and the spacers with a substantially planar upper surface, leaving open the portion of the second metallic layer which covers the first encapsulated electrode contact E;

$i_2$) removing the portion of the second metallic layer which covers the first encapsulated electrode contact E, this first electrode contact E being protected by its encapsulation and the second electrode contact B being protected by the third dielectric layer;

$i_3$) removing the spacers and the encapsulation of the first electrode contact E; and $i_4$) removing the third dielectric layer and lifting-off the mask and the portion of the second metallic layer which covers it.

9. A method as claimed in claim 8, characterized in that during step $i_1$) the third dielectric layer is realised by a planarizing method, in photoresist or polyimide.

10. A method as claimed in claim 8, characterized in that during step $i_2$) the removal of the portion of the metal layer is effected by chemical means.

11. A method as claimed in claim 5, characterized in that during step $f_0$) the specific value $h_1$ is taken to be equal to the desired distance between the first and the second electrode contacts.

12. A method according to claim 5, further comprising the formation of a non-planar bipolar heterojunction transistor, which method realises this transistor through at least forming three superimposed semiconductor layers of alternating conductivity types being from the lower to the upper layer a collector layer, a base layer, and an emitter layer, respectively, with at least one heterojunction between the base layer and the emitter layer, characterized in that the emitter and base contacts, the first electrode contact E and second electrode contact B are formed on respective layers.

13. A method as claimed in claim 12, characterized in that, for forming the collector contacts C of the bipolar heterojunction transistor, the third electrode contacts, it comprises in addition:

$j_0$) forming a mask having openings coinciding with the regions destined for the collector contacts C, $k_0$) etching of the semiconductor layers in these openings down to the collector layer, $l_0$) depositing a third metal layer for forming the collector contacts, and $m_0$) lifting-off the mask and of the undesirable portion of the third metal layer which covers it.

* * * * *